US007335935B2

(12) United States Patent
Sinha et al.

(10) Patent No.: US 7,335,935 B2
(45) Date of Patent: Feb. 26, 2008

(54) SEMICONDUCTOR STRUCTURES

(75) Inventors: Nishant Sinha, Boise, ID (US); Dinesh Chopra, Boise, ID (US); Fred D. Fishburn, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 357 days.

(21) Appl. No.: 11/188,235

(22) Filed: Jul. 22, 2005

(65) Prior Publication Data

US 2006/0003583 A1 Jan. 5, 2006

Related U.S. Application Data

(62) Division of application No. 10/822,030, filed on Apr. 8, 2004, now Pat. No. 7,005,379.

(51) Int. Cl.
*H01L 27/108* (2006.01)
*H01L 29/76* (2006.01)
*H01L 29/94* (2006.01)
*H01L 31/119* (2006.01)

(52) U.S. Cl. ............... 257/296; 257/532; 257/E27.016; 257/E27.048

(58) Field of Classification Search ................ 257/296, 257/532, E27.016, E27.048
See application file for complete search history.

(56) References Cited

U.S. PATENT DOCUMENTS 5,169,680 A 12/1992 Ting et al.
5,464,653 A 11/1995 Chantraine et al.
2002/0153614 A1 10/2002 Ema et al.
2005/0017338 A1 1/2005 Fukazawa
2005/0074959 A1 4/2005 Burrell et al.
2005/0104228 A1 5/2005 Rigg et al.
2005/0176199 A1* 8/2005 Ozaki et al. ................ 438/257
2005/0186777 A1 8/2005 Kirby et al.
2007/0076509 A1* 4/2007 Zhang ................... 365/230.03

FOREIGN PATENT DOCUMENTS

| | | |
|---|---|---|
| EP | 0 382 298 A1 | 8/1990 |
| JP | 63-15443 | 1/1988 |
| JP | 3-190136 | 8/1991 |
| WO | 2005/009781 | 3/2005 |

* cited by examiner

*Primary Examiner*—Ngân V. Ngô
(74) *Attorney, Agent, or Firm*—Wells St. John P.S.

(57) ABSTRACT

Electroless plating can be utilized to form electrical interconnects associated with semiconductor substrates. For instance, a semiconductor substrate can be formed to have a dummy structure thereover with a surface suitable for electroless plating, and to also have a digit line thereover having about the same height as the dummy structure. A layer can be formed over the dummy structure and digit line, and openings can be formed through the layer to the upper surfaces of the dummy structure and digit line. Subsequently, a conductive material can be electroless plated within the openings to form electrical contacts within the openings. The opening extending to the dummy structure can pass through a capacitor electrode, and accordingly the conductive material formed within such opening can be utilized to form electrical contact to the capacitor electrode.

15 Claims, 13 Drawing Sheets

SEMICONDUCTOR STRUCTURES

RELATED PATENT DATA

This patent resulted from a divisional application of U.S. patent application Ser. No. 10/822,030, now U.S. Pat. No. 7,005,379 which was filed Apr. 8, 2004; and which is hereby incorporated by reference.

TECHNICAL FIELD

The invention pertains to semiconductor processing methods for forming electrical contacts, and also pertains to semiconductor structures.

BACKGROUND OF THE INVENTION

Semiconductor fabrication processes frequently involve formation of electrical interconnects within openings. The desired aspect ratio of the openings is increasing for various reasons, including, for example, to compensate for losses in capacitance or inductance. As the aspect ratio increases, it becomes increasingly difficult to conformally fill openings with traditional processes. FIGS. 1 and 2 illustrate an exemplary prior art process, and a problem that can occur during an attempt to form an electrical interconnection within an opening.

FIG. 1 shows a semiconductor construction 10 at a preliminary processing stage. Construction 10 comprises a base 12. The base can comprise, consist essentially of, or consist of monocrystalline silicon lightly-doped with background p-type dopant. The base 12 can be referred to as a "substrate", and/or various combinations of structures can be referred to as a "substrate". To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A conductive block 14 is formed over base 12. Block 14 can correspond to, for example, a digit line.

An insulative material 16 is formed over base 12 and over block 14. Insulative material 16 can comprise, for example, borophosphosilicate glass (BPSG).

An opening 18 is etched through insulative material 16 to an upper surface of conductive block 14. Opening 18 can be formed utilizing, for example, photolithographic processing to generate a patterned photoresist mask (not shown) which defines a location for opening 18, followed by an etch into material 16 to generate the opening 18, and subsequent removal of the photoresist mask. The opening is shown having vertical sidewalls, but it is to be understood that such is an idealized structure. Frequently the opening will have non-vertical sidewalls due to limitations in etching processes.

Referring to FIG. 2, a first conductive material 20 is formed over insulative material 16 and within opening 18. Conductive material 20 can comprise, for example, a metal nitride (such as titanium nitride) and can be formed by, for example, chemical vapor deposition. A second conductive material 22 is formed over conductive material 20. Second conductive material 22 can comprise, for example, tungsten and can also be formed by, for example, chemical vapor deposition. The first layer 20 can function as an adhesive for adhering the second layer 22 to insulative material 16.

A problem that occurs during deposition of one or both of materials 20 and 22 is that the conductive material can grow non-conformally at upper corners proximate opening 18 to form extensions 24. The extensions 24 can ultimately pinch off the top of opening 18 before the opening has been conformally filled with conductive materials 20 and 22. Accordingly, a void 26 remains in the opening. Such void is frequently referred to as a "keyhole". The shape of the opening 18 and keyhole 26 are shown diagrammatically in FIGS. 1 and 2, and it is to be understood that the opening and keyhole can have other shapes. Such other shapes can include a concave "bow" near the top of opening 26 due to limitations in the ability of etches to form the shown vertical sidewalls. The bow can provide additional complications to a conformal fill which can exacerbate keyhole problems and lead to formation of large keyholes just below the upper surface of material 16. Such large keyholes can undesirably be exposed in subsequent polishing processes. It is desired to develop new methods for filling openings which alleviate, and preferably prevent, formation of keyholes.

SUMMARY OF THE INVENTION

In one aspect, the invention encompasses a semiconductor processing method for forming an electrical contact. A semiconductor substrate is provided. The substrate has a surface suitable for electroless plating, a layer over the surface, and a node supported by the layer. An opening is formed through the layer and to the suitable surface. A periphery of the opening includes an electrically conductive portion of the node. A conductive material is electroless plated within the opening, with the electroless plating being initiated from the suitable surface. The electroless-plated material forms an electrical contact to the node.

In one aspect, the invention encompasses a semiconductor processing method for forming electrical contacts to a capacitor electrode and a digit line. A semiconductor substrate is provided. The substrate supports a digit line and a spacer structure. The digit line comprises a region, and the spacer structure comprises another region. The digit line region has an upper surface, and the spacer structure region has another upper surface. The digit line region upper surface is at about the same elevational height over the substrate as the spacer structure region upper surface. The semiconductor substrate further comprises electrically insulative material over the digit line region and the spacer structure region, and a capacitor electrode supported by the insulative material. Openings are formed through the insulative material. One of the openings is a first opening that extends to the upper surface of the digit line region, and another of the openings is a second opening and extends to the upper surface of the spacer structure region. The second opening has a periphery which includes an electrically conductive portion of the capacitor electrode. A conductive material is electroless plated within the first and second openings. The electroless plating initiates from the upper surfaces of the digit line region and the spacer structure region. The electroless-plated material forms an electrical contact with the digit line in the first opening, and forms an electrical contact with the capacitor electrode in the second opening. The spacer structure can be referred to as a "dummy" structure in particular aspects of the invention to indicate that the structure is an electrical dead-end and thus comprises no electrical purpose. The spacer structure instead has-the physical purpose of mimicking the height of the digit line. In other words, the term "dummy structure" is to be understood herein as referring to a structure which is utilized to mimic a physical property of another structure (such as to mimic the height of a digit line structure), and which is circuit inoperable (i.e., which is not part of a current flow path of a circuit). The dummy structure can comprise a single layer or a combination of different layers.

In one aspect, the invention encompasses a semiconductor structure. The structure includes a semiconductor substrate, a digit line supported by the substrate, and a spacer structure supported by the substrate. The digit line can comprise a single layer or multiple layers, and frequently will comprise a stack of TiN/silicon/$WSi_x$; similarly, the spacer structure can comprise a single layer or multiple layers. The digit line comprises a first region having an upper surface at a first elevational height over the semiconductor substrate. The spacer structure comprises a second region having an upper surface at an elevational height over the substrate which is about the same as the first elevational height. The spacer structure is a dummy structure. The semiconductor structure includes electrically insulative material supported by the semiconductor substrate. The electrically insulative material is over the digit line and the spacer structure regions. A capacitor structure is supported by the insulative material. The capacitor structure includes a first capacitor electrode, a second capacitor electrode and at least one dielectric material between the first and second capacitor electrodes. A first conductive interconnect extends upwardly from the digit line region and through the insulative material, and a second conductive interconnect extends upwardly from the spacer structure region, through only one of the first and second capacitor electrodes, and through the insulative material. The first and second conductive interconnects are of the same composition as one another.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes methods which utilize electroless plating to form electrical interconnects within openings. An advantage of electroless plating is that such can be conducted to fill an opening from the bottom of the opening to the top, and accordingly can fill high aspect ratio openings without the prior art problem of pinching off a top of the opening during the fill process.

Figure 1:
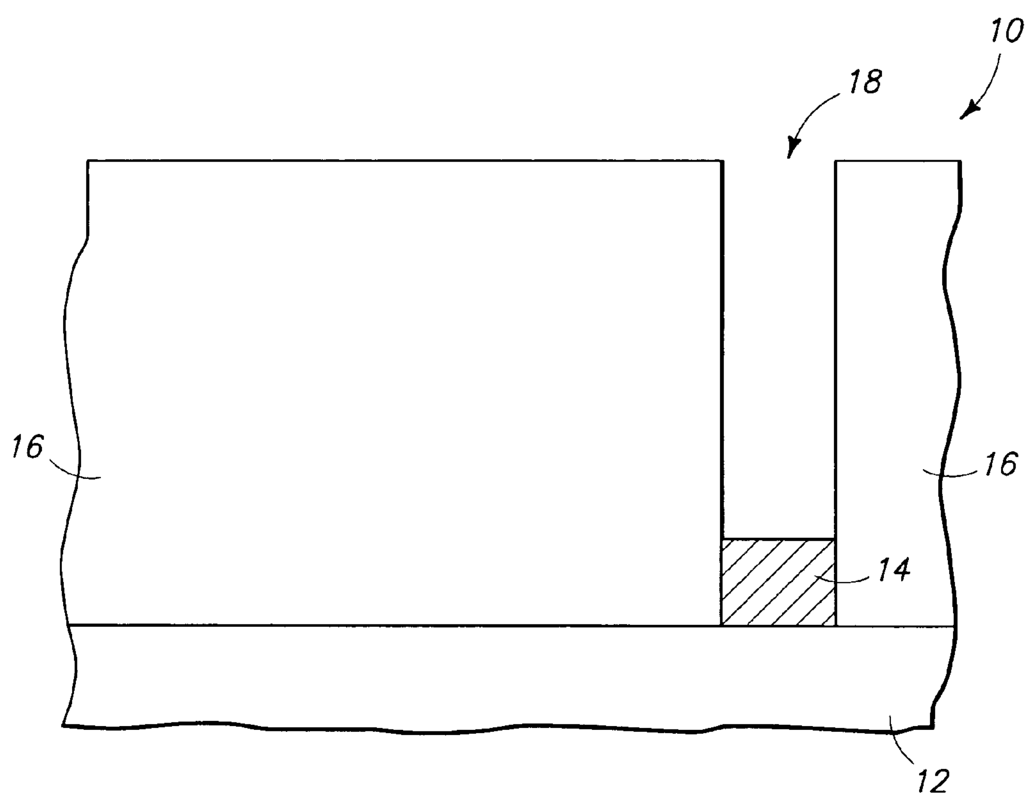
FIG. 1 is a diagrammatic, cross-sectional view of a semiconductor wafer fragment shown at a preliminary prior art processing stage.
Figure 2:
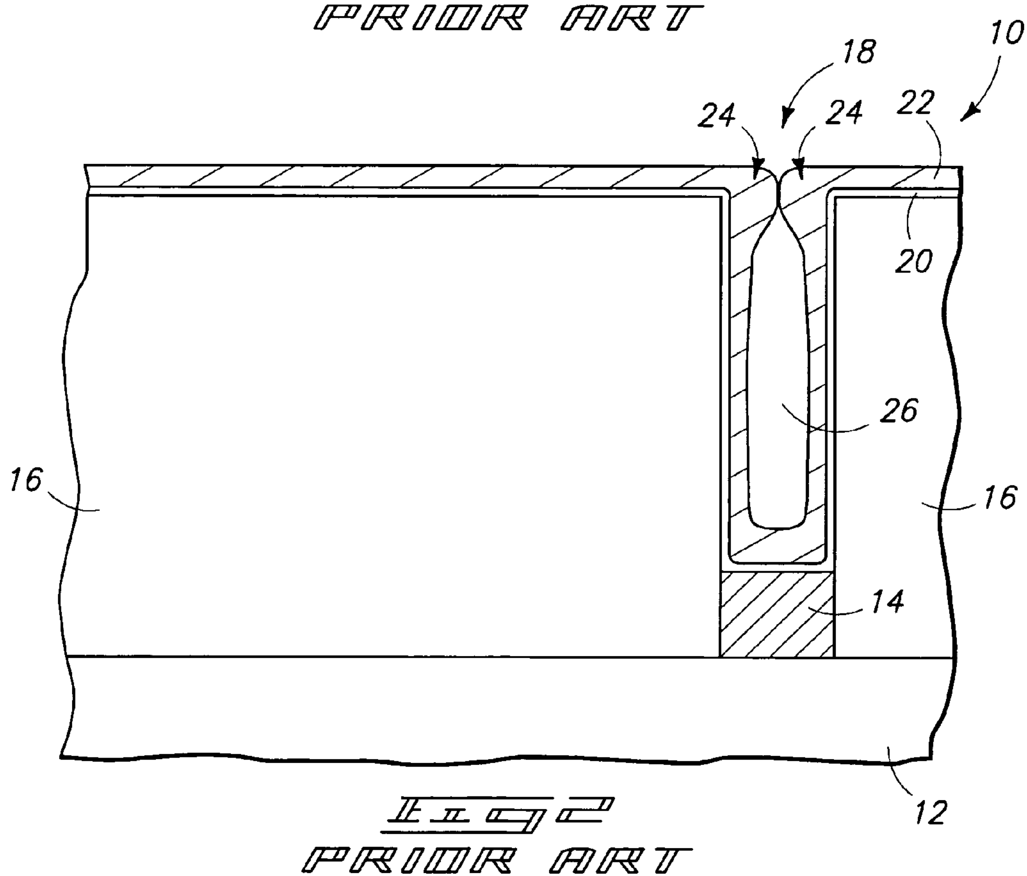
FIG. 2 is a view of the FIG. 1 wafer fragment shown at a prior art processing stage subsequent to that of FIG. 1.
Figure 3:
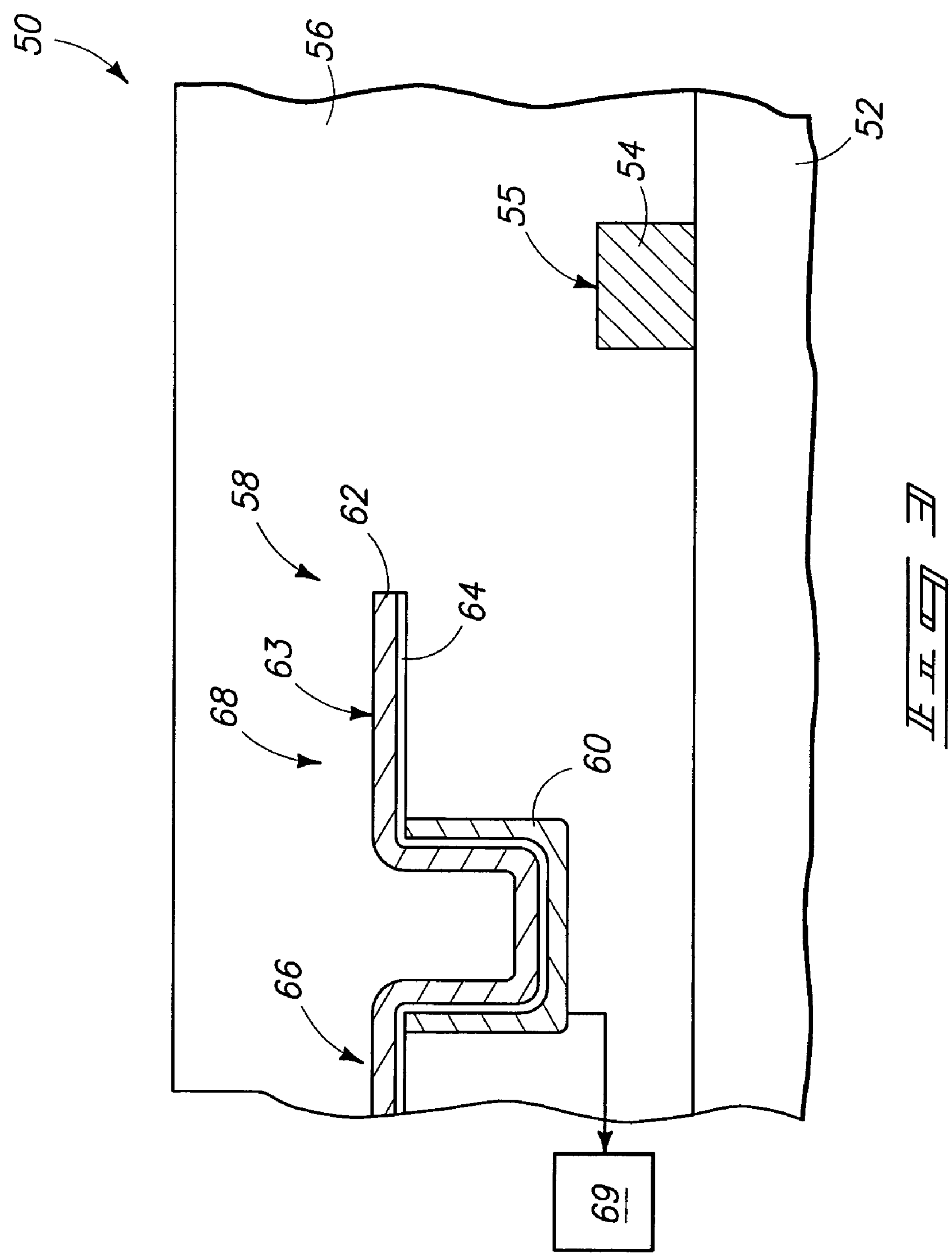
FIG. 3 is a diagrammatic, cross-sectional view of a semiconductor wafer fragment shown at a preliminary processing stage of an exemplary method of the present invention.

One aspect of the invention is to utilize electroless plating to form interconnects to two or more circuit structures which are at different elevational heights relative to one another. FIG. 3 illustrates a semiconductor construction 50 which can be utilized in such aspect of the invention. Construction 50 comprises a base 52 which can comprise monocrystalline silicon, and which can have the same construction as discussed previously with reference to the base 12 of FIGS. 1 and 2. A conductive structure 54 is formed over base 52. Structure 54 can correspond to, for example, a digit line. Although the structure is shown being uniformly conductive throughout its thickness, it is to be understood that the structure can comprise layers of electrically insulative and electrically conductive materials. The uppermost conductive material will have a top surface, and such top surface corresponds to an uppermost conductive surface 55 of structure 54. If structure 54 comprises a stack of electrically insulative and electrically conductive materials, the top surface 55 can be the uppermost surface of the stack, or can be covered by an electrically insulative cap. Regardless, the upper conductive surface will typically ultimately be exposed in subsequent processing, such as, for example, the processing described below with reference to FIG. 4.

The FIG. 3 structure comprises an electrically insulative layer 56 over base 52 and over structure 54. Electrically insulative layer 56 can comprise any suitable material, including, for example, BPSG.

A capacitor structure 58 is supported by electrically insulative layer 56. Capacitor structure 58 comprises a first capacitor electrode 60, a second capacitor electrode 62, and at least one dielectric material 64 between capacitor electrodes 60 and 62. Capacitor electrodes 60 and 62 can comprise any suitable electrically conductive materials, including, for example, metals, metal compositions, and/or conductively-doped silicon. In particular aspects, electrode 60 corresponds to a storage node of the capacitor and electrode 62 corresponds to a plate electrode of the capacitor. One or both of the capacitor electrodes can, in some aspects, comprise conductively-doped silicon (such as conductively-doped polycrystalline silicon) and/or a metal composition, such as, for example, one or more of TiN, WN and WSi; with the listed compositions being shown in terms of the elements contained therein rather than in terms of a particular stoichiometry of the elements within the compositions.

The dielectric material 64 can comprise any suitable material, including, for example, one or more of silicon dioxide, silicon nitride, and various high-k dielectric materials.

Capacitor storage node 60 is shown electrically connected to a transistor device 69. As is known to persons of ordinary skill in the art, transistor device 69 would typically comprise a gate (not shown) and a pair of source/drain regions (not shown). Storage node 60 would be connected to one of the source/drain regions, and the other of the source/drain regions would be connected to a bit line (or digit line) (not shown). Accordingly, the transistor gate would gatedly connect storage node 60 to the bit line. The capacitor structure 58 thus can be utilized as a memory storage unit of a memory cell. Specifically, the combination of a transistor structure with a capacitor is a typical unit cell of a dynamic random access memory (DRAM) device. A plurality of the capacitors and transistors can be incorporated into a DRAM array, as is known to persons of ordinary skill in the art.

The shown capacitor construction 58 comprises storage node 60 in a container shape, and comprises dielectric material 64 and capacitor plate electrode 62 extending within the container shape of storage node 60. The shown capacitor construction also comprises horizontally-extending segments 66 and 68 laterally adjacent the portions of the materials 64 and 62 within the container opening. Horizontally-extending segments 66 and 68 can be exactly horizontal, can be substantially horizontal, or can simply be horizontal relative to portions of materials 64 and 62 along the sidewalls of the container opening. Capacitor plate electrode 62 has an upper surface 63 which extends along the horizontally-extending segments 66 and 68, and which also extends within the container shape of storage node 60. The illustrated capacitor construction is an exemplary construction, and it is to be understood that numerous other shapes of capacitor constructions can be utilized in various aspects of the invention.

As discussed previously, the term "substrate" is defined herein to be broad enough to encompass any supporting structure or combination of structures, and the term "semiconductor substrate" is broad enough to encompass any combination of structures provided that one of the structures contains a semiconductor material. Accordingly, either base 52 or structure 54 can be considered a substrate in various aspects of the invention, and also the combination of structure 54 and base 52 can be considered a substrate (or semiconductor substrate) in various aspects of the invention. Additionally, capacitor structure 58 can be considered a substrate in various aspects of the invention, and can be considered a semiconductor substrate if either of the electrodes comprises conductively-doped silicon. Further, the combination of capacitor 58 with base 52 can be considered a semiconductor substrate. Also, the combination of capacitor structure 58, layer 56 and base 52 can be considered a semiconductor substrate, as can the combination of capacitor 58, layer 56, structure 54 and base 52.

Although layer 56 is shown comprising a homogeneous composition, it is to be understood that the layer can be replaced with a stack of layers. The stacked layers can have the same composition as one another or different compositions. Also, although the same material 56 is shown over the structure 54 and around the capacitor 58, it is to be understood that different insulative materials can be over the structure 54 than are around the capacitor 58 in some aspects of the invention. Thus, the insulative material over structure 54 can be referred to as a first insulative material and the insulative material proximate the capacitor 58 can be referred to as a second insulative material. In the shown aspect of the invention, the first and second insulative materials are comprised by common layer 56, and in other aspects of the invention the first and second insulative materials can differ from one another. Further, although the material of layer 56 is shown both above and below capacitor 58, it is to be understood that a different insulative material can be over capacitor 58 than is under capacitor 58 in some aspects of the invention. If the insulative material over the capacitor is different than the insulative material under the capacitor, the insulative material under the capacitor can be referred to as a layer supporting the capacitor and the insulative material over the capacitor can be referred to as being supported by the capacitor.

Figure 4:
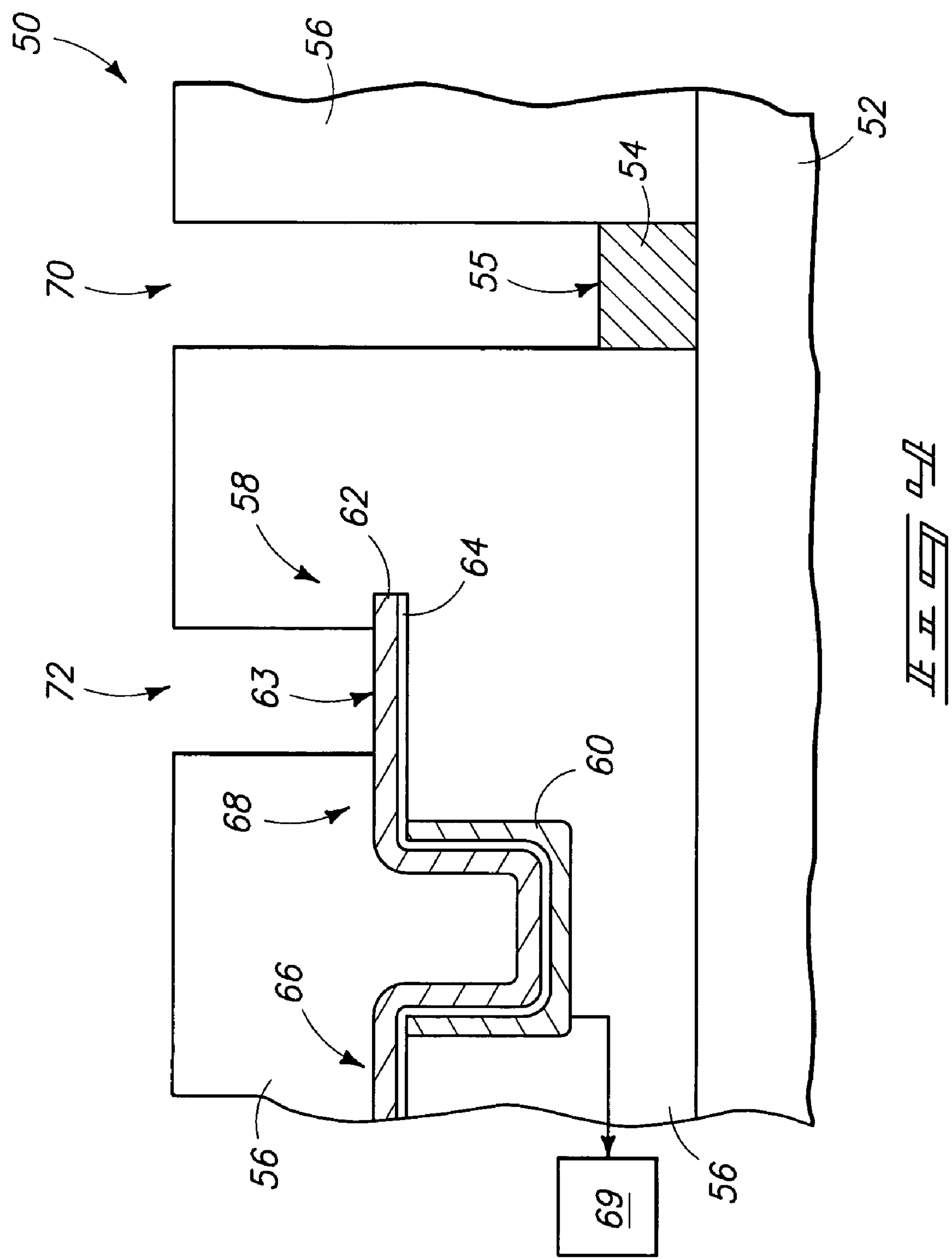
FIG. 4 is a view of the FIG. 3 wafer fragment shown at a processing stage subsequent to that of FIG. 3.

Referring to FIG. 4, openings 70 and 72 are etched through layer 56 to upper surface 63 of capacitor structure 58 and to upper surface 55 of conductive structure 54. Openings 70 and 72 can be formed utilizing photolithographic processing and an appropriate etch. Specifically, photolithographic processing can be used to form a patterned photoresist mask (not shown) which defines the locations of openings 70 and 72, a subsequent etch can be used to form the openings through layer 56, and then the photoresist mask can be removed.

Openings 70 and 72 have a comparable width to one another, but opening 70 is much deeper than is opening 72. For instance, opening 70 can have a depth of about 3 microns and opening 72 can have a depth of about 1 micron in particular aspects of the invention. In other words, a thickness of layer 56 over segment 68 of capacitor structure 58 can be about 1 micron and a thickness of layer 56 over upper surface 55 of conductive structure 54 can be about 3 microns in particular aspects of the invention.

Although layer 56 is shown as a homogeneous material, at least a portion of layer 56 can be replaced by a stack of insulative materials as discussed previously. In such aspects of the invention, at least one of openings 70 and 72 can extend through the stack of insulative materials.

Figure 5:
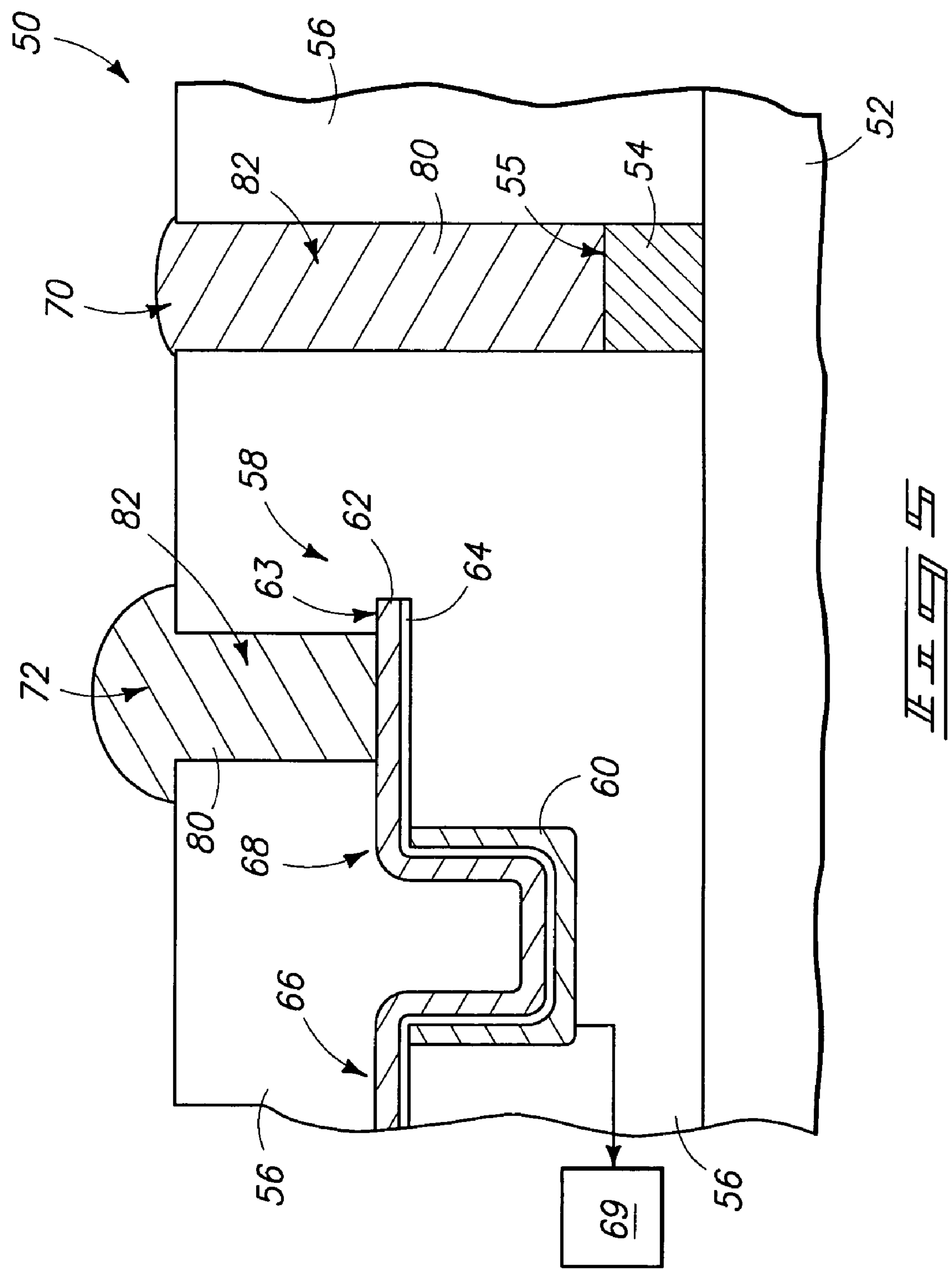
FIG. 5 is a view of the FIG. 3 wafer fragment shown at a processing stage subsequent to that of FIG. 4.

Referring to FIG. 5, a conductive material 80 is electroless plated within openings 70 and 72 to form electrical interconnects 82 and 84 extending within openings 70 and 72, respectively. Conductive material 80 can comprise, consist essentially of, or consist of, for example, one or more of palladium, zinc, silver, nickel and cobalt. In particular aspects, conductive material 80 will comprise, consist essentially of, or consist of nickel, cobalt, nickel-containing alloys or cobalt-containing alloys.

The electroless plating initiates at upper surfaces 55 and 63 of structures 54 and 62, and accordingly conductive material 80 grows within openings 70 and 72 from the bottoms of the openings to the tops of the openings. Such bottom-up growth can uniformly fill the openings.

As is known to persons of ordinary skill in the art, electroless plating initiates from surfaces which are suitable for the electroless plating. A surface suitable for electroless plating is a surface on which the electroless plating self-initiates from a bath rather than requiring a catalyst to initiate. Suitable surfaces can comprise, for example, one or more of palladium, zinc, silver, nickel and cobalt. Thus, surfaces 55 and 63 can be rendered suitable for initiation of electroless plating by forming the surfaces from materials comprising, consisting essentially of, or consisting of one or more of palladium, zinc, silver, nickel and cobalt. In some aspects, surfaces 55 and 63 can comprise compositions suitable for electroless plating prior to formation of layer 56 over the surfaces. Alternatively, surfaces 55 and 63 can be formed of compositions which are not suitable for electroless plating, and which are subsequently activated after formation of openings 70 and 72. The surfaces can be activated by exposing the surfaces to one or more of nickel, cobalt, palladium, zinc and silver to either incorporate one or more of nickel, cobalt, palladium, zinc and silver into the composition of the upper surfaces or to form a layer containing one or more of nickel, cobalt, palladium, zinc and silver over the upper surfaces. Thus, the composition of surfaces 55 and 63 can be, in particular aspects of the invention, unsuitable for electroless plating when layer 56 is formed over the surfaces, and then portions of the surfaces can be rendered suitable for electroless plating after such portions are exposed through openings 70 and 72.

Compositions unsuitable for electroless plating are typically compositions which do not contain at least one of nickel, cobalt, palladium, zinc or silver in sufficient quantity to initiate electroless plating. Compositions suitable for initiation of electroless plating without activation can be referred to as "self-catalyzing" surfaces, and surfaces needing activation to be suitable for initiation of electroless plating can be referred to as "non-self-catalyzing" surfaces.

In particular aspects of the invention, opening 72 will have a depth which is much less than the depth of opening 70. The electroless plating will form about the same amount of material within opening 72 as is formed within opening 70. Accordingly, formation of sufficient material to fill opening 70 will result in a large amount of excess material formed over opening 72. Thus, a large hump of excess material is shown formed over opening 72, and a substantially smaller hump of material is shown formed over opening 70. The disparity in the thickness of excess material 80 over opening 72 relative to the thickness over opening 70 can complicate subsequent processing. Specifically, it can be difficult to remove the excess conductive material by planarization when the thickness of the excess material has a large variation across the upper surface of layer 56. Additionally, if spacing between 70 and 72 is half of the height difference, material 80 overfilling opening 72 can pinch off opening 70 before opening 70 is filled.

Figure 6:
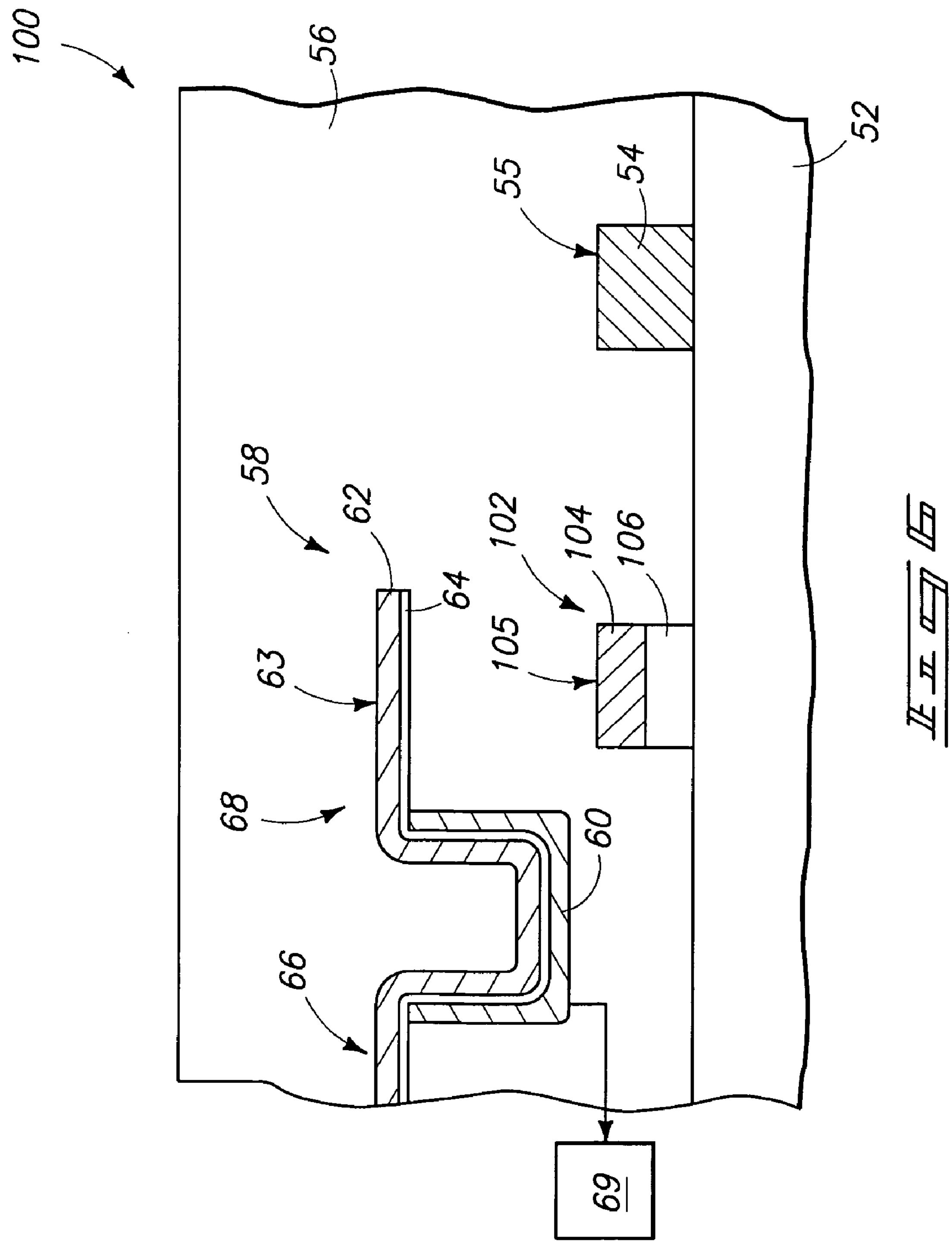
FIG. 6 is a diagrammatic, cross-sectional view of a semiconductor wafer fragment shown at a preliminary processing stage alternative to that of FIG. 3.
Figure 7:
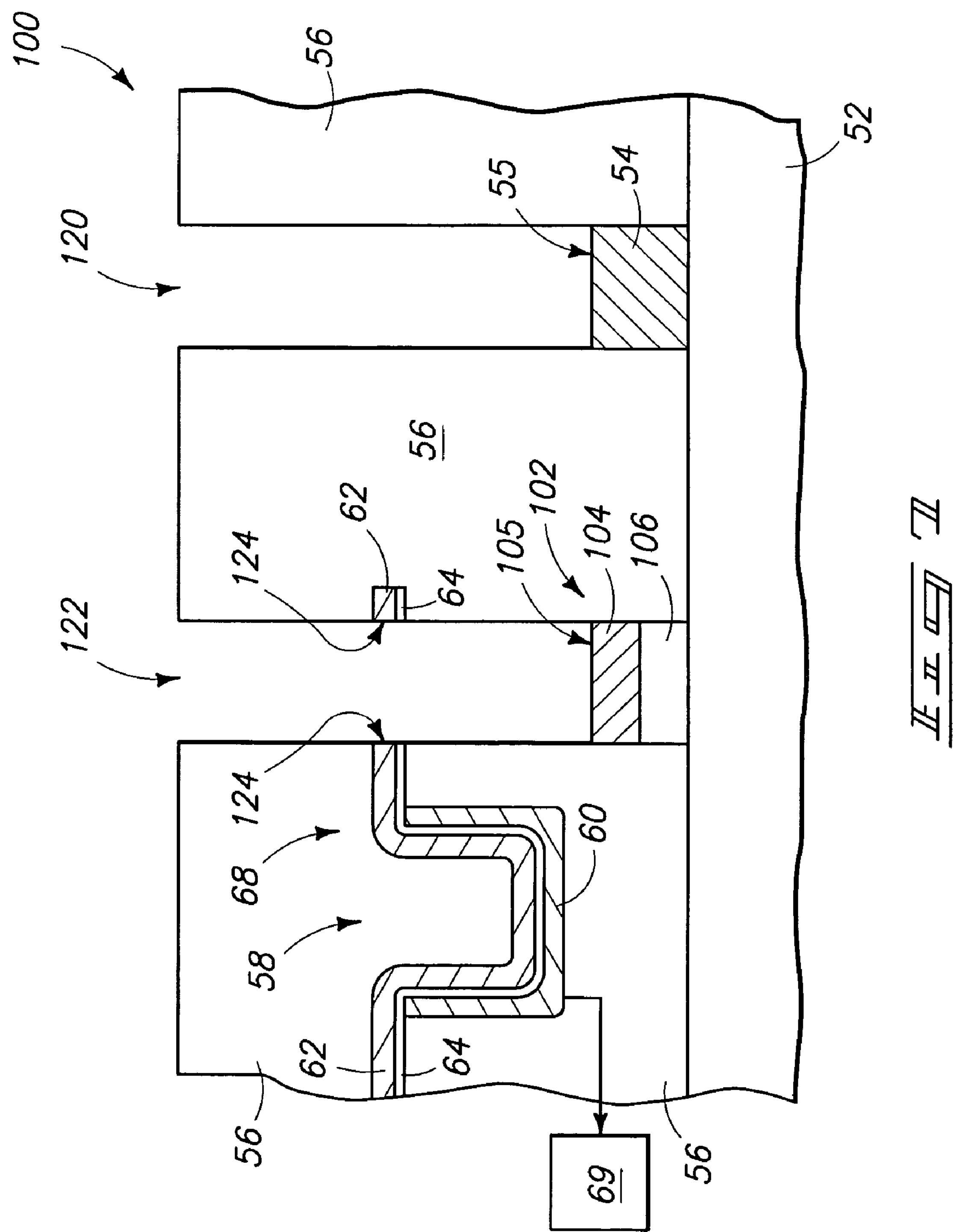
FIG. 7 is a view of the FIG. 6 wafer fragment shown at a processing stage subsequent to that of FIG. 6.
Figure 8:
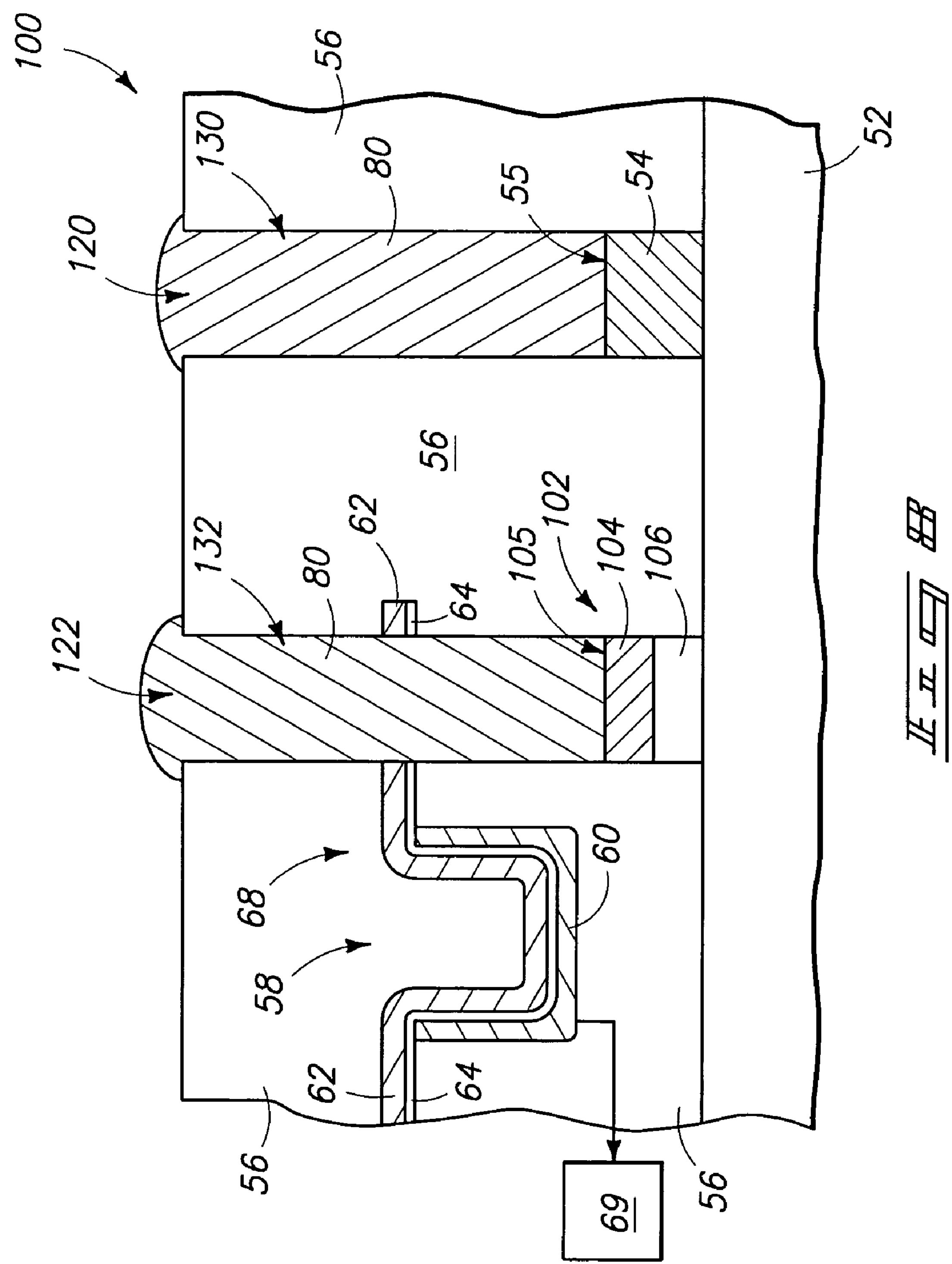
FIG. 8 is a view of the FIG. 6 wafer fragment shown at a processing stage subsequent to that of FIG. 7.

FIGS. 6-8 illustrate an aspect of the invention which alleviates the disparate thicknesses of material 80 over openings 70 and 72. Referring initially to FIG. 6, a construction 100 is illustrated at a preliminary processing stage of a second embodiment aspect of the present invention. Construction 100 comprises a number of features identical to those described previously with reference to FIGS. 3-5, and such features are labeled the same in FIG. 6 as they were labeled in FIGS. 3-5.

The construction 100 of FIG. 6 differs from the construction 50 of FIGS. 3-5 in that a spacer structure 102 is provided in construction 100. Spacer structure 102 comprises a conductive material 104 having an upper surface 105, and is illustrated shaped as a block in the cross-sectional view of FIG. 6. Upper conductive surface 105 typically comprises the same chemical composition as upper conductive surface 55 of structure 54. Further, upper conductive surface 105 has about the same elevational height over-base 52 as does upper conductive surface 55. Accordingly, structure 102 can be considered a spacer having an upper conductive surface 105 spaced from base 52 by about the same distance as upper surface 55 of structure 54 is spaced from base 52.

Structure 102 can be referred to as a "dummy" structure if the structure has no purpose except to space upper conductive surface 105 from base 52. In such aspects, structure 102 is not connected to circuit devices, and ultimately is an electrical dead end for any electrical interconnect that extends to structure 102. In particular aspects of the invention, structure 54 is a digit line and structure 102 is a "dummy" structure that mimics at least the portion of the digit line where an electrical interconnection is ultimately to be formed.

The digit line 54 will extend into and out of the page in the shown cross section of FIG. 6. Accordingly, the portion of the digit line shown in FIG. 6 corresponds to a specific region of the digit line. Other regions of the digit line can have a different thickness of conductive material than the shown thickness, and accordingly upper surface 55 may be at a different elevational height at regions of digit line 54 that are not visible in FIG. 6. Structure 102 can similarly be formed to be a line extending into and out of the page relative to the view of FIG. 6, and upper surface 105 can similarly have different elevational heights relative to base 52 at regions of structure 102 that are not visible in the view of FIG. 6. However, upper conductive surface 105 is at the same elevational height over base 52 as is upper conductive surface 55 of the digit line in at least the regions of the structures 102 and 54 visible in FIG. 6.

Structure 102 is shown comprising a stack of materials, and specifically is shown comprising conductive material 104 over an electrically insulative material 106. It is to be understood that structure 102 can comprise any of numerous configurations which can include a conductive material alone, or a conductive material in combination with insulative materials. Further, although conductive material 104 is shown as the uppermost material of the stack of spacer 102, it is to be understood that an electrically insulative cap could be formed over conductive material 104. Ultimately, however, an opening is typically formed which extends to the uppermost conductive surface 105 of structure 102, and accordingly such opening would extend through any insulative cap formed over-uppermost surface 105.

Structure 102 is beneath a portion of capacitor 58, and in the shown aspect of the invention is beneath horizontally-extending segment 68 of capacitor plate electrode 62.

Referring to FIG. 7, openings 120 and 122 are formed through layer 56 to upper conductive surfaces 55 and 105, respectively. Openings 120 and 122 can be referred to as first and second openings in the discussion that follows. Opening 120 is identical to the opening 70 discussed previously (FIG. 4). Opening 122 is in an identical location as the opening 72 discussed previously (FIG. 4), but unlike opening 72 extends entirely through capacitor dielectric 64 and capacitor plate electrode 62. Opening 122 thus has a periphery which includes an electrically conductive portion of electrode 62. Such electrically conductive portion of the periphery of opening 122 is labeled as 124 in FIG. 7. Openings 120 and 122 can be referred to as being formed through first and second insulative materials, respectively. In the shown aspect of the invention the first and second insulative materials are comprised by a common layer, but, as discussed above, the first and second insulative materials can differ from one another in other aspects of the invention.

Since conductive surfaces 55 and 105 are at about the same elevational height as one another (and preferably are at an identical elevational height within the tolerances of a semiconductor fabrication process), openings 120 and 122 will be about the same depth as one another (and preferably will be at an identical depth to one another within the limitations of tolerances associated with a particular fabrication process).

In particular aspects of the invention, upper surface 105 can be considered a portion of a semiconductor substrate. Further, surface 105 will ultimately be suitable for electroless plating. When surface 105 is suitable for electroless plating, the combination of structure 102 and semiconductor base 52 can be considered a semiconductor substrate having the surface 105 suitable for electroless plating. Layer 62 can be considered an electrically conductive node, and accordingly opening 122 can be considered to be formed through the electrically conductive node and to the surface 105 suitable for electroless plating.

Upper surfaces 55 and 105 can be formed to be suitable for initiating electroless plating by patterning materials 54 and 104 from compositions suitable for electroless plating and/or by activating upper surfaces of materials 54 and 104 after formation of openings 120 and 122. Accordingly, upper surfaces 55 and 105 can be suitable for electroless plating prior to provision of layer 56; or can be rendered suitable by activation occurring after formation layer 56, and specifically after formation of openings 120 and 122 extending through layer 56. In preferred aspects, surface 105 of material 104 is identical in composition to surface 55 of material 54. In such aspects, surfaces 55 and 105 can comprise one or more of palladium, zinc, silver, nickel and cobalt. It can be preferred that surfaces 55 and 105 comprise one or both of nickel and cobalt in particular semiconductor processing applications.

Referring to FIG. 8, conductive material 80 is electroless plated within openings 120 and 122. Conductive material 80 can comprise, consist essentially of, or consist or one or more of palladium, zinc, silver, nickel and cobalt; and in particular aspects will consist essentially of, or consist of one or both of nickel and cobalt. The electroless plating of material 80 can comprise conventional methods. For instance, the electroless plating can be conducted utilizing one or both of cobalt sulfate and nickel sulfate together with appropriate reducing agents, such as, for example, ammonium hypophosphite and/or dimetal-amino-borane. Conductive material 80 would typically comprise some phosphorous and/or boron in addition to the electroless-plated metal due to boron and/or phosphorous being present in reducing agents utilized during the electroless-plating process. Accordingly, conductive material 80 can, in particular aspects, comprise, consist essentially of, or consist of one or more of palladium, zinc, silver, nickel and cobalt, in combination with one or both of phosphorous and boron. Choosing one or more of palladium, zinc, silver, nickel and cobalt can enable a plating bath to be made stable, and yet still sufficient to initiate plating of material 80 on materials 54 and 104 but not on materials 62 and 64. The materials 62 and 64 would need appropriate activation (with, for example, one or more of Pd, Sn, Zn, etc) for plating to initiate thereon.

The conductive material within openings 120 and 122 forms conductive interconnects 130 and 132, respectively. Conductive interconnect 130 extends to structure 54. As discussed previously, structure 54 can comprise a digit line, and accordingly conductive interconnect 130 can be utilized for interconnecting the digit line to other circuitry (not shown). Conductive interconnect 132 extends to capacitor plate electrode, and can thus be utilized for connecting plate electrode 62 to other circuitry (not shown). Conductive interconnect 132 also extends to conductive material 104. However, in typical processing conductive material 104 will be electrically isolated from any circuitry other than conductive interconnect 132, and accordingly will be an electrical dead-end (or terminus).

Figure 9:
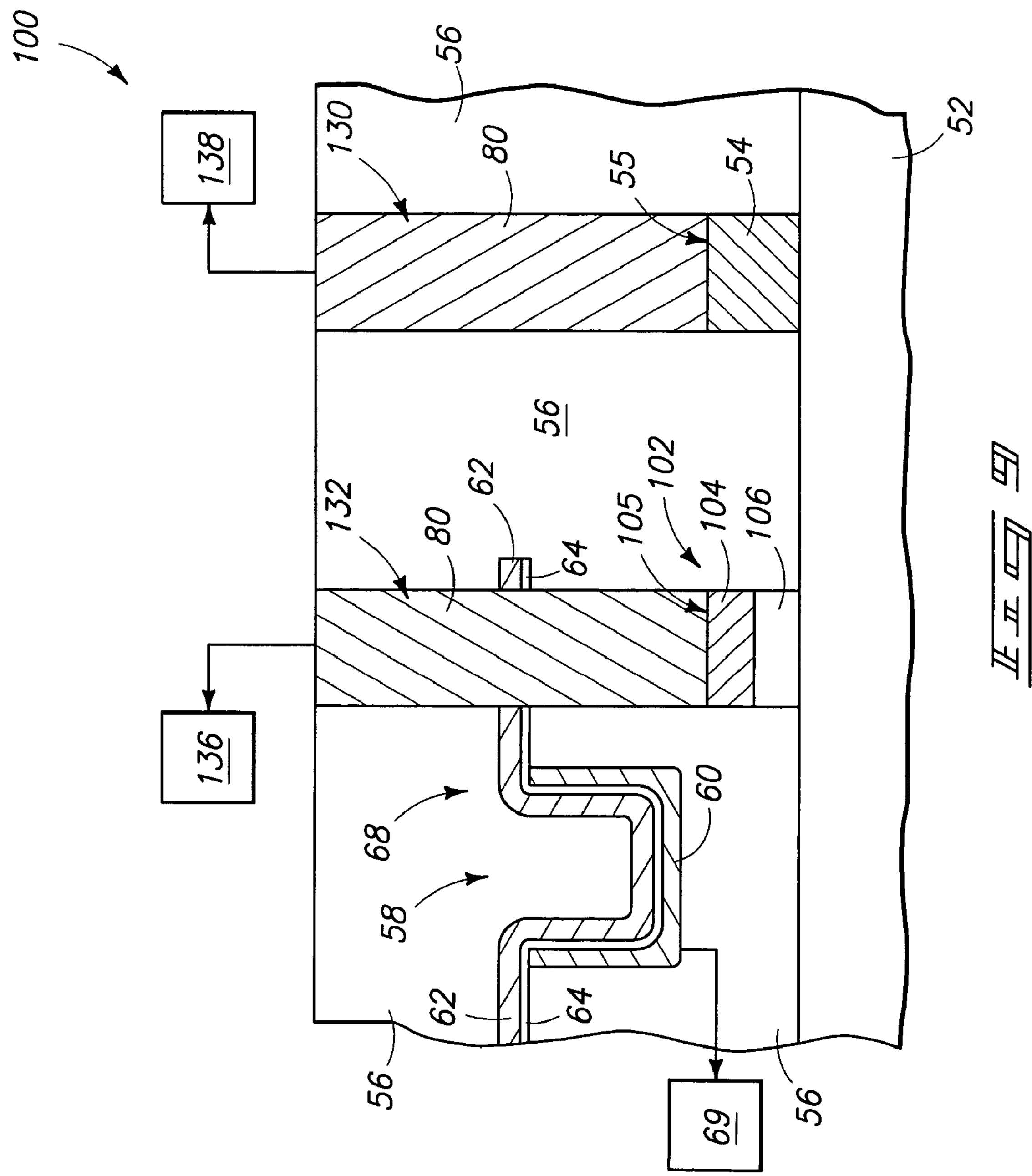
FIG. 9 is a view of the FIG. 6 wafer fragment shown at a processing stage subsequent to that of FIG. 8.

Referring to FIG. 9, upper surfaces of electrical interconnects 130 and 132 are planarized. Such can be accomplished utilizing, for example, chemical-mechanical polishing. Interconnects 130 and 132 are then connected to appropriate circuitry 134 and 136, respectively. Accordingly, interconnect 130 forms an electrical contact between circuitry 134 and structure 54 (with structure 54 being, for example, a digit line), and interconnect 132 forms an electrical contact between circuitry 136 and capacitor plate electrode 62.

Various modifications can be made to the shown aspect of the invention, as will be understood by persons of ordinary skill in the art. For instance, although conductive interconnect 132 is shown extending through both dielectric material 64 and capacitor electrode 62, the invention can encompass other aspects (not shown) in which capacitor electrode 62 extends beyond dielectric material 64, and in which the interconnect extends only through capacitor electrode 62 rather than through both capacitor 62 and dielectric material 64. As another example of a modification that can be incorporated into aspects of the invention, interconnect 132 can be formed to be adjacent an end of electrode 62 so that the conductive interconnect 132 is formed beside electrode 162, rather than through the electrode. As another example, processing of the present invention can be utilized to form electrical connection to a node 62 other than a capacitor electrode.

The structure of FIG. 9 can be, in particular aspects, considered to comprise a digit line 54 and a spacer structure 102 which have shown regions with upper surfaces 55 and 105, respectively, at about the same elevational height as one another. The structure further comprises a layer 56 supported by a base (or substrate) 52, and a capacitor structure supported by the layer. A first conductive interconnect 130 extends from the digit line and through the layer 56; and a second conductive interconnect 132 extends from spacer structure 102, through capacitor electrode 62 and dielectric material 64 (and not through capacitor electrode 60). The first and second electrical interconnects 130 and 132 were formed simultaneously during the same electroless plating procedure, and accordingly comprise the same composition as one another.

The conductive interconnects 130 and 132 can be formed in relatively high-aspect ratio openings, with such openings being formed to any suitable depth, including, for example, depths of greater than or equal to about 3 microns. Thus, layer 56 can have a thickness of at least about 3 microns in the vicinity proximate the shown region of digit line 54, and can also comprise a thickness of at least about 3 microns proximate the shown region of spacer structure 102.

Although capacitor 58 and digit line 54 are shown adjacent one another in the aspect of the invention described with reference to FIG. 9, it is to be understood that numerous intervening devices (not shown) can be provided in a space between the capacitor and the digit line, and accordingly the capacitor and the digit line can be separated by a relatively large distance in other aspects of the invention (not shown).

Figure 10:
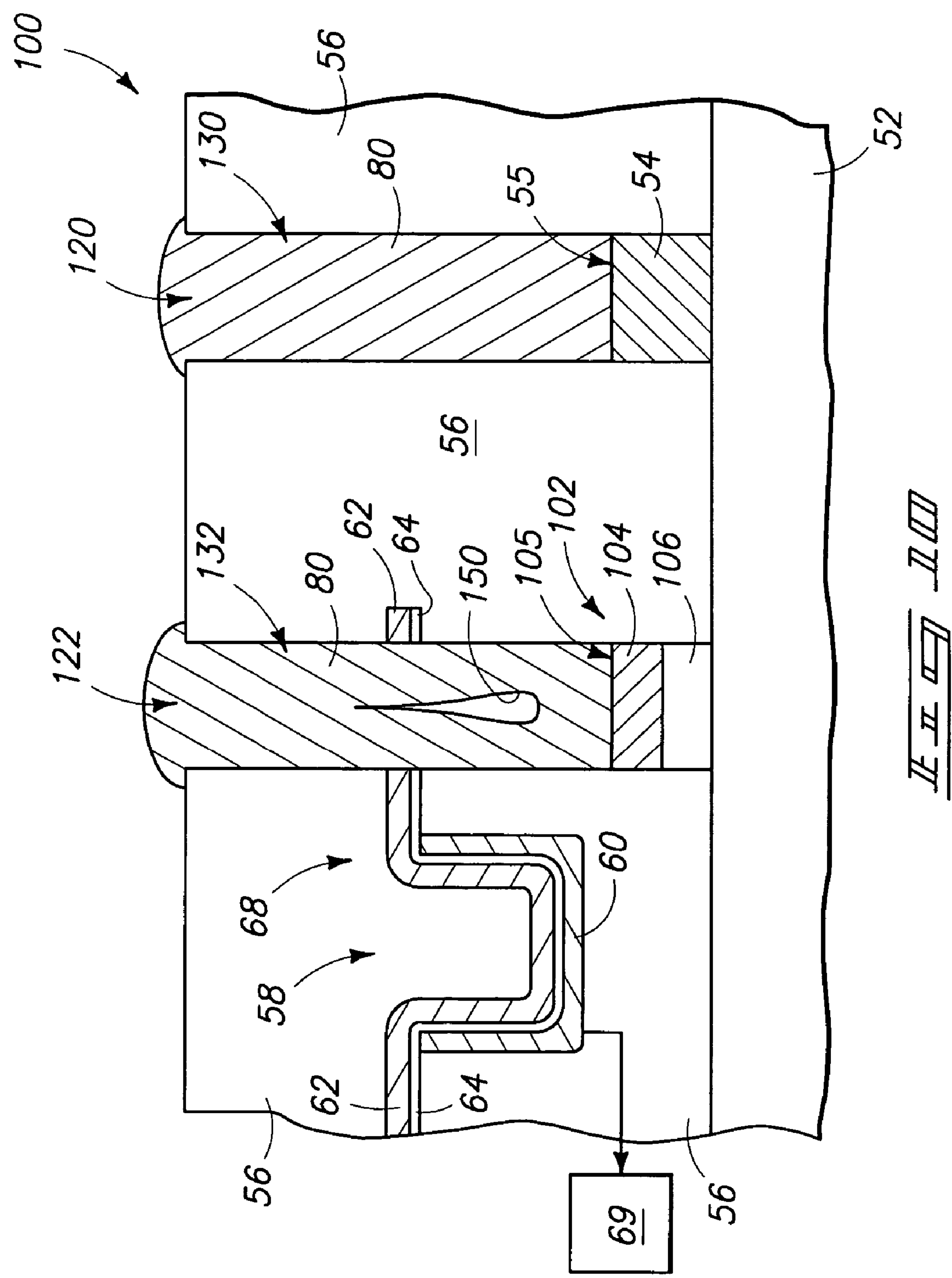
FIG. 10 is a view of the FIG. 6 wafer fragment shown at a processing stage subsequent to that of FIG. 6, and in accordance with an embodiment of the invention alternative to the embodiment described previously with reference to FIGS. 7-9.

As described with reference to FIGS. 7 and 8, upper surfaces 55 and 105 of structures 54 and 104 can be suitable for electroless plating by either forming such structures from compositions suitable for initiation of electroless plating, or by activation of compositions after exposing the compositions through openings 120 and 122. A problem which can occur if surfaces 55 and 105 are activated after formation of openings 120 and 122 is that such activation may also activate exposed portions 124 (FIG. 7) of electrode 62. Accordingly, electroless plating may initiate not only at surfaces 55 and 105, but also at exposed portions 124 of electrode 162. Such can lead to undesired closure of the middle portion of opening 122 before electroless-plated material 80 completely fills a lower portion of the opening. This problem is illustrated in FIG. 10 where a keyhole 150 is shown formed within conductive interconnect 132, as would occur if the portion of opening 122 (FIG. 7) were closed at about the region of electrode 62 due to electroless plating initiation from exposed portions 124 (FIG. 7) of electrode 62. Accordingly, it can be preferred to form upper surfaces 55 and 105 of an appropriate composition from which electroless plating will initiate without activation, and further to form electrode 62 of a composition from which electroless plating will not initiate without activation. The electroless plating can then selectively initiate from surfaces 55 and 105 without initiation from exposed portions 124 (FIG. 7) of electrode 62, and accordingly keyhole 150 (FIG. 10) can be avoided.

Figure 11:
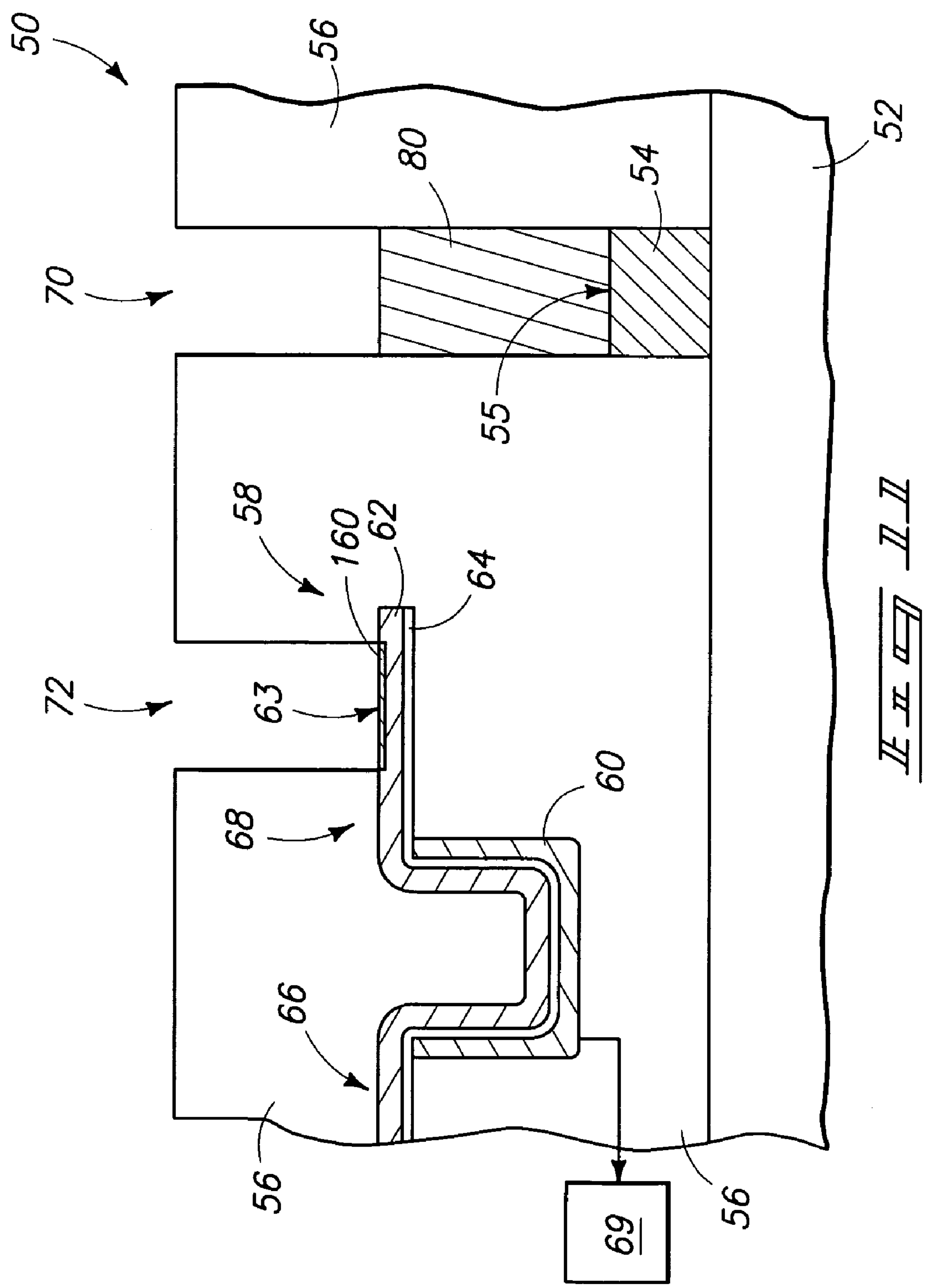
FIG. 11 is a view of the FIG. 3 wafer fragment shown at a processing stage subsequent to that of FIG. 4 in accordance with a fourth aspect of the invention.
Figure 12:
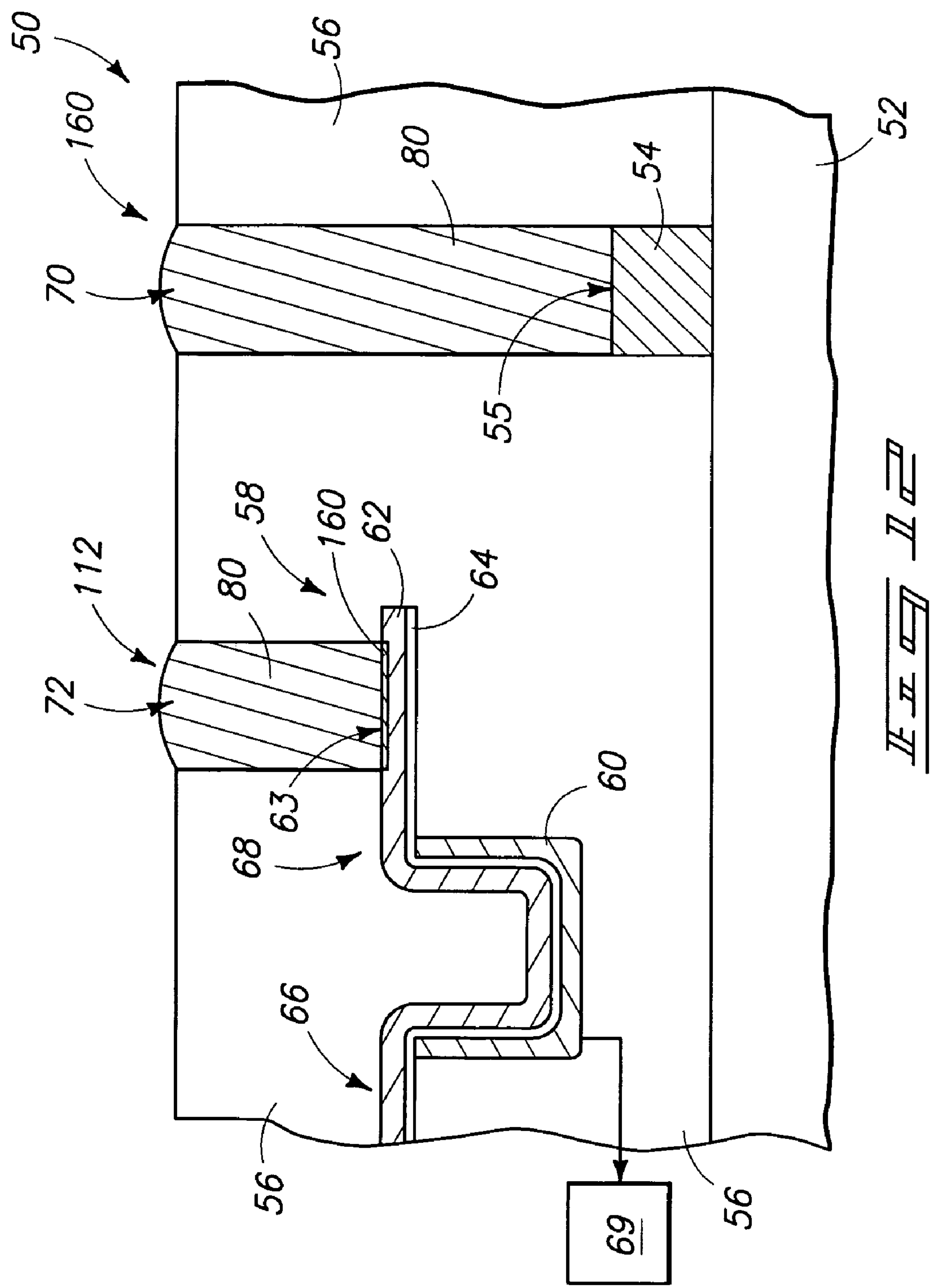
FIG. 12 is a view of the FIG. 3 wafer fragment shown at a processing stage subsequent to that of FIG. 11 in accordance with the fourth aspect of the invention.

FIGS. 11 and 12 illustrate a further aspect of the invention. Such aspect can follow the processing stage of FIG. 4. Referring initially to FIG. 4, surface 55 of digit line 54 can comprise a suitable material for electroless plating, while surface 63 comprises a material which is not suitable for electroless plating. FIG. 11 shows construction 50 after the electroless plating has been conducted for sufficient time to form conductive material 80 within opening 70 to approximately the same elevational level as the upper surface 63 of capacitor 62. Subsequently, upper surface 63 can be activated so the surface is now suitable for electroless plating. Such activation is represented by the thin layer 160 shown at upper surface 63 in FIG. 11. The activation can be conducted in accordance with procedures discussed previously in this application.

After the activation of surface 63, the electroless plating can be continued so that conductive material 80 fills opening 70, and also fills opening 72. Since the openings 70 and 72 were approximately the same depth as one another at the initiation of the second stage of the electroless plating (i.e., at the process stage of FIG. 11), the conductive material 80 formed within openings 70 and 72 fills the openings to about the same level. Such forms caps 160 and 162 over openings 70 and 72, respectively, that are about the same size as one another. The caps can be removed by subsequent planarization, similarly to the planarization of interconnects 130 and 132 discussed previously with reference to FIGS. 8 and 9.

The processing of FIGS. 4, 11 and 12 can be considered to comprise the following sequence.

Initially, a semiconductor substrate 52 is provided, with such substrate supporting an electrically insulative material 56 and a pair of electrical nodes 54 and 62. Nodes 54 and 62 can be referred to as a first node and a second node, respectively. A first opening 70 extends through the electrically insulative material to the first node and a second opening 72 extends through the electrically insulative material to the second node at the processing stage of FIG. 4. The first node 54 is at a first elevational height over the substrate and the second node 63 is at a second elevational height over the substrate, with the first elevational height being less than the second elevational height. Accordingly the first opening 70 is deeper than the second opening 72. The first electrical node has a first surface exposed within the first opening and the second electrical node has a second surface exposed within the second opening. The first surface is suitable for electroless plating and the second surface is not suitable for electroless plating at the processing stage of FIG. 4. Subsequently, a first conductive material 80 is electroless plated within the first opening to form a first conductive material plug extending to a height within the first opening that is about the same as the elevational height of the second node. Such forms the construction of FIG. 11.

The second surface is then activated to render the second surface suitable for electroless plating. Subsequently, a second conductive material is electroless plated within the first and second openings to form the construction of FIG. 12. The second conductive material within the first opening forms a second conductive material plug extending upwardly from the first conductive material plug, and the second material within the second opening forms a second conductive material plug extending upwardly from the second node. In the shown aspect of the invention, the first and second electroless plated materials are the same as one another, and specifically both correspond to material 80. However, it is to be understood that the invention also encompasses aspect in which the first and second electroless-plated materials are not compositionally the same as one another.

Figure 13:
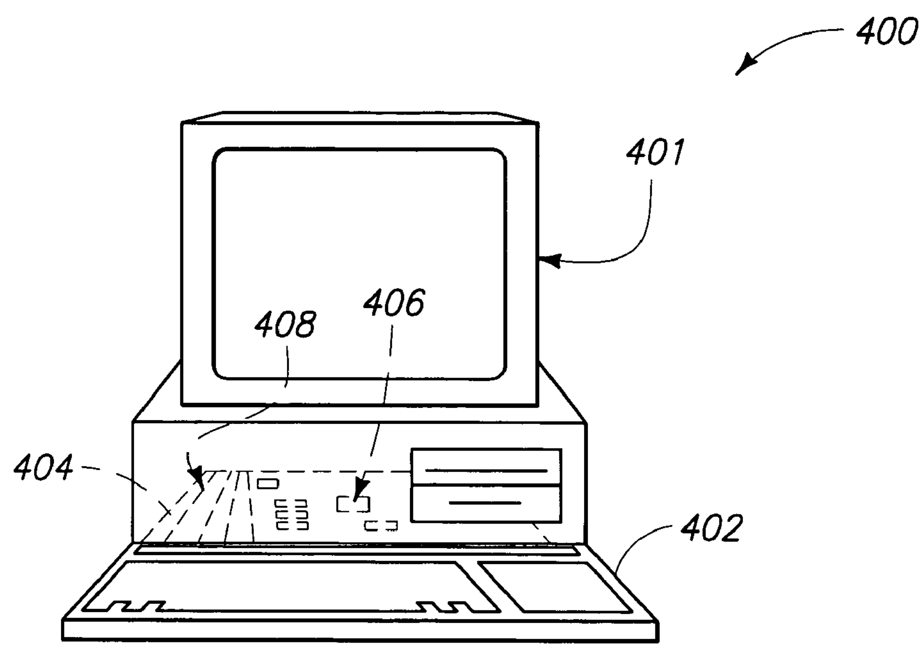
FIG. 13 is a diagrammatic view of a computer illustrating an exemplary application of the present invention.
Figure 14:
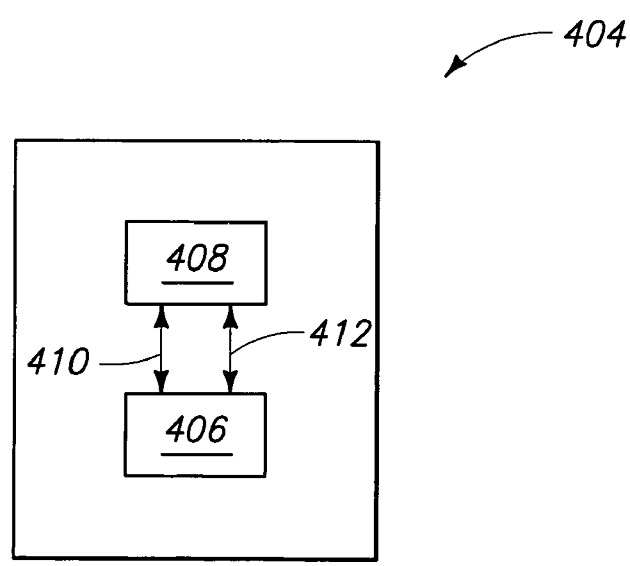
FIG. 14 is a block diagram showing particular features of the motherboard of the FIG. 13 computer.

FIG. 13 illustrates generally, by way of example but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 14. In such block diagram, the addressing circuitry is illustrated as 410 and the read circuitry is illustrated as 412. Various components of computer system 400, including processor 406, can comprise one or more of the memory constructions described previously in this disclosure.

Processor device 406 can correspond to a processor module, and associated memory utilized with the module can comprise teachings of the present invention.

Memory device 408 can correspond to a memory module. For example, single in-line memory modules (SIMMS) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Memory device 408 can comprise memory formed in accordance with one or more aspects of the present invention.

Figure 15:
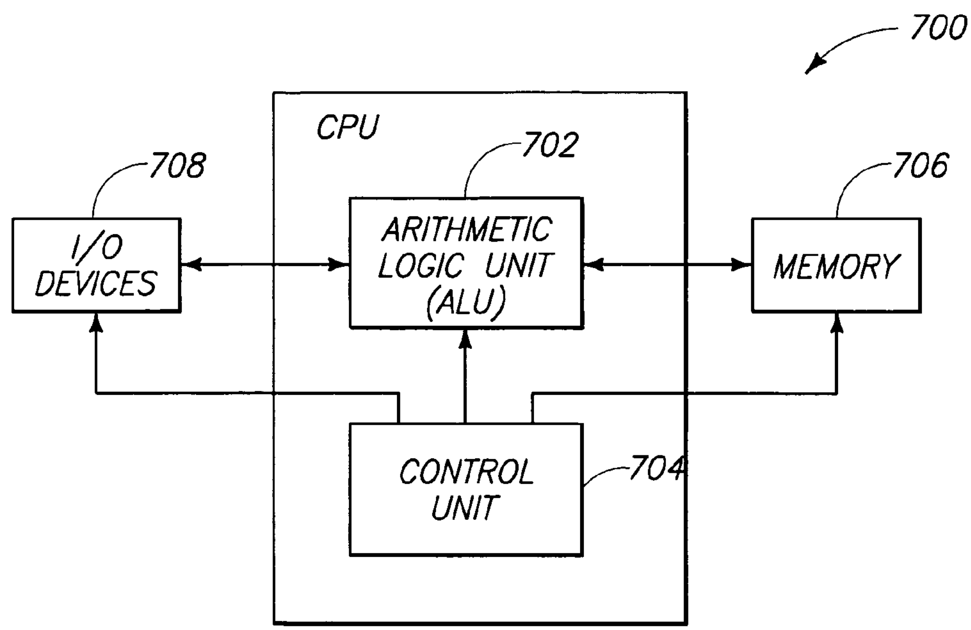
FIG. 15 is a high-level block diagram of an-electronic system according to an exemplary aspect of the present invention.

FIG. 15 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include memory constructions in accordance with various aspects of the present invention.

Figure 16:
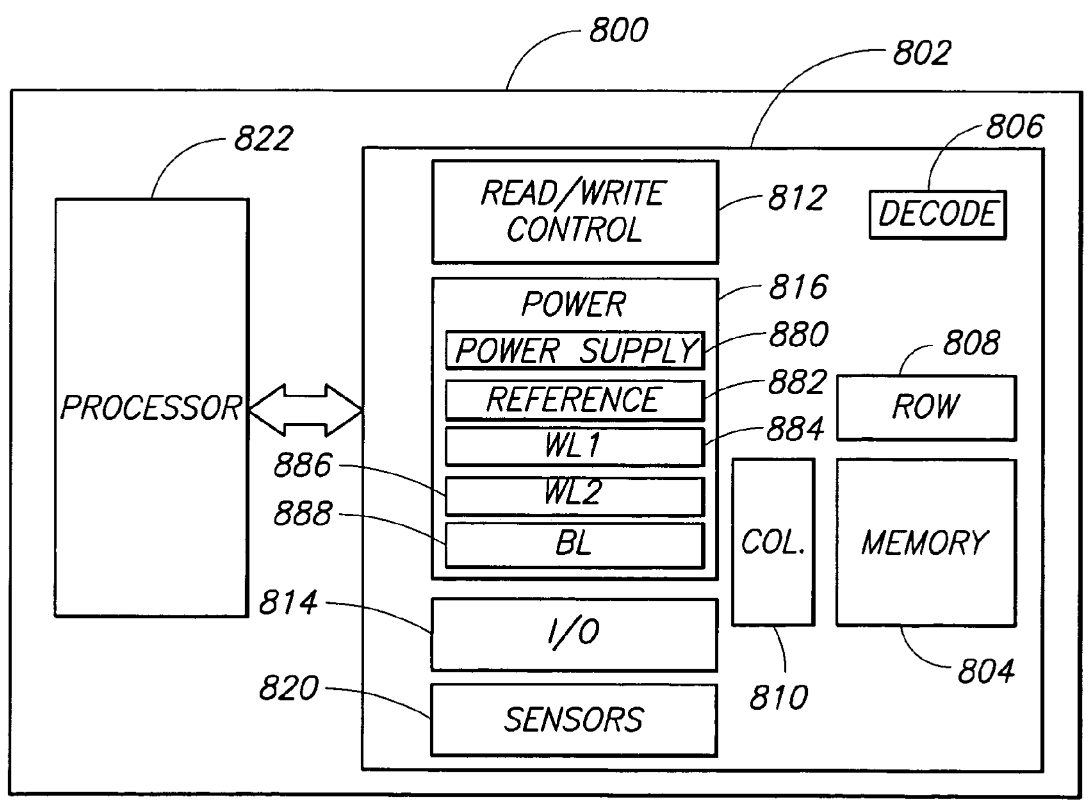
FIG. 16 is a simplified block diagram of an exemplary memory device according to an aspect of the present invention.

FIG. 16 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a memory construction of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device (s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

It is noted that relative elevational relationships are utilized to describe the locations of various features to one another (e.g., upward, downward, etc are utilized) within this disclosure. It is to be understood that such terms are used to express relative relations between the components only, and not to indicate a relationship of the components relative to an external frame of reference. Thus, for example, a feature described herein as projecting upwardly relative to another feature may in fact appear to extend downwardly to a viewer in an external frame of reference relative to the feature.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor structure, comprising:

a semiconductor substrate;

a digit line supported by the semiconductor substrate, the digit line comprising a first region, the first region having an upper surface at a first elevational height over the semiconductor substrate;

a dummy structure supported by the semiconductor substrate, the dummy structure comprising a second region; and the second region having an upper surface at a second elevational height over the semiconductor substrate, the first and second elevational heights being about the same as one another;

a first insulative material supported by the semiconductor substrate and being over the digit line region;

a second insulative material supported by the semiconductor substrate and being over the dummy structure region;

a capacitor structure supported by the second insulative material, the capacitor structure including a first capacitor electrode, a second capacitor electrode and at least one dielectric material between the first and second capacitor electrodes;

a first conductive interconnect extending upwardly from the digit line region and through the first insulative material, the first conductive interconnect being of a composition; and a second conductive interconnect extending upwardly from the dummy structure region, through only one of the first and second capacitor electrodes and through the second insulative material; the second conductive interconnect being of the same composition as the first conductive interconnect.

2. The structure of claim 1 wherein said only one of the first and second capacitor electrodes comprises one or more of TiN, WN and WSi, with the listed compositions being shown in terms of the elements contained therein rather than in terms of a particular stoichiometry of the elements within the compositions.

3. The structure of claim 1 wherein the first and second insulative materials are comprised by a common layer.

4. The structure of claim 3 wherein the common layer comprises BPSG.

5. The structure of claim 3 wherein the common layer is over the capacitor structure and below the capacitor structure, and wherein the common layer comprises a thickness of at least about 3 microns proximate the digit line region and proximate the dummy structure region.

6. The structure of claim 5 wherein second conductive interconnect extends through a segment of said only one of the first and second capacitor electrodes, and wherein the common layer comprises a thickness of less than or equal to about 1 micron over said segment.

7. The structure of claim 1 wherein the second conductive interconnect extends through the at least one dielectric material.

8. The structure of claim 1 wherein the composition of the first and second conductive interconnects comprises one or more of palladium, silver, zinc, nickel and cobalt.

9. The structure of claim 8 wherein the composition of the first and second conductive interconnects comprises palladium.

10. The structure of claim 8 wherein the composition of the first and second conductive interconnects comprises silver.

11. The structure of claim 8 wherein the composition of the first and second conductive interconnects comprises zinc.

12. The structure of claim 8 wherein the composition of the first and second conductive interconnects comprises nickel.

13. The structure of claim 8 wherein the composition of the first and second conductive interconnects comprises cobalt.

14. A DRAM array comprising:

a semiconductor substrate;

a plurality of transistors supported by the semiconductor substrate;

a plurality of capacitors electrically coupled with the transistors;

a plurality of digit lines supported by the semiconductor substrate, the digit lines having upper surfaces at a first elevational height over the semiconductor substrate;

a plurality of dummy structures supported by the semiconductor substrate, the dummy structures comprising upper surfaces at a second elevational height over the semiconductor substrate, the first and second elevational heights being about the same as one another;

a first insulative material supported by the semiconductor substrate and being over the digit lines;

a second insulative material supported by the semiconductor substrate and being over the dummy structures;

the capacitors being supported by the second insulative material, individual capacitors including a first capacitor electrode, a second capacitor electrode and at least one dielectric material between the first and second capacitor electrodes;

first conductive interconnects extending upwardly from the digit lines and through the first insulative material, the first conductive interconnects being of a composition; and second conductive interconnects extending upwardly from the dummy structures, through either the first or second capacitor electrodes and through the second insulative material; the second conductive interconnects being of the same composition as the first conductive interconnects.

15. An electronic system comprising:

a processor;

a memory device in data communication with the processor; and wherein at least one of the memory device and the processor comprises:

a semiconductor substrate;

a plurality of capacitors supported by the semiconductor substrate;

a plurality of digit lines supported by the semiconductor substrate, the digit lines having upper surfaces at a first elevational height over the semiconductor substrate;

a plurality of dummy structures supported by the semiconductor substrate, the dummy structures comprising upper surfaces at a second elevational height over the semiconductor substrate, the first and second elevational heights being about the same as one another;

a first insulative material supported by the semiconductor substrate and being over the digit lines;

a second insulative material supported by the semiconductor substrate and being over the dummy structures;

the capacitors being supported by the second insulative material, individual capacitors including a first capacitor electrode, a second capacitor electrode and at least one dielectric material between the first and second capacitor electrodes;

first conductive interconnects extending upwardly from the digit lines and through the first insulative material, the first conductive interconnects being of a composition; and second conductive interconnects extending upwardly from the dummy structures, through either the first or second capacitor electrodes and through the second insulative material; the second conductive interconnects being of the same composition as the first conductive interconnects.

* * * * *